US011600506B2

(12) United States Patent
Chou et al.

(10) Patent No.: US 11,600,506 B2
(45) Date of Patent: Mar. 7, 2023

(54) WAFER POD TRANSFER ASSEMBLY

(71) Applicant: TAIWAN SEMICONDUCTOR MANUFACTURING COMPANY LIMITED, Hsin-Chu (TW)

(72) Inventors: Chih-Wei Chou, Zhubei (TW); Sheng-Yuan Lin, Hsinchu (TW); Yuan-Hsin Chi, Longjing Township, Taichung County (TW); Yin-Tun Chou, Hsinchu (TW); Hung-Chih Wang, Zhubei (TW); Yu-Chi Liu, Taoyuan (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 17/382,506

(22) Filed: Jul. 22, 2021

(65) Prior Publication Data
US 2022/0344191 A1 Oct. 27, 2022

Related U.S. Application Data

(60) Provisional application No. 63/179,177, filed on Apr. 23, 2021.

(51) Int. Cl.
*H01L 21/677* (2006.01)
*B65G 47/90* (2006.01)

(52) U.S. Cl.
CPC ........ *H01L 21/67766* (2013.01); *B65G 47/90* (2013.01)

(58) Field of Classification Search
CPC . H01L 21/67766; B65G 47/90; B65G 47/904; Y10T 403/7075; Y10T 403/7077; Y10T 403/7079; Y10T 403/7083; Y10T 403/7084; Y10T 403/7088; Y10T 403/7091; Y10T 24/44769; Y10T 24/44778; Y10T 24/44803; F16B 21/09; F16B 21/10; F16B 21/12; F16B 21/14
USPC ...... 403/376, 377, 378, 379.2, 379.3, 379.5, 403/379.6; 24/545, 546, 549
See application file for complete search history.

(56) References Cited

U.S. PATENT DOCUMENTS 422,057 A * 2/1890 Montgomery ............ B60R 3/02
24/549
1,401,429 A * 12/1921 Moone ................. B65G 47/252
198/379
(Continued)

OTHER PUBLICATIONS

Home Depot, "1/4" Safety Pin (2-3/4" Pin Length)," Accessed Jun. 17, 2022, Jun. 4, 2019 oldest comment, https://www.homedepot.eom/p/CURT-1-4-Safety-Pin-2-3-4-Pin-Length-25080/205631609? (Year: 2019).*

*Primary Examiner* — Gerald McClain
(74) *Attorney, Agent, or Firm* — Cooper Legal Group, LLC

(57) ABSTRACT

A wafer pod transfer assembly includes a wafer pod port to receive a wafer pod, a transfer axle coupled to the wafer pod port, a shaft receiver, a shaft coupled to the transfer axle and to the shaft receiver, a pin through the shaft receiver and through the shaft, wherein the pin comprises a first end and a second end, opposite the first end, and a pin buckle including a first loop and a second loop. The pin buckle is coupled to the pin, the first loop encircles the first end of the pin, and the second loop encircles the second end of the pin.

20 Claims, 7 Drawing Sheets

(56) References Cited

U.S. PATENT DOCUMENTS

| | | | | |
|---|---|---|---|---|
| 1,438,549 | A | * | 12/1922 | Parish .................... F16B 21/16 74/550 |
| 2,739,000 | A | * | 3/1956 | Muirhead ................. F16B 7/00 411/517 |
| 5,704,100 | A | * | 1/1998 | Swan .................... F16B 21/186 24/546 |
| 6,357,320 | B1 | * | 3/2002 | Ford ........................ B62D 1/10 74/552 |
| 9,604,320 | B1 | * | 3/2017 | Fuentes ................ B23K 37/053 |
| 10,928,001 | B2 | * | 2/2021 | Kraige .................. F16F 9/0218 |
| 2018/0107094 | A1 | * | 4/2018 | Yowler ..................... F16B 9/09 |
| 2019/0135446 | A1 | * | 5/2019 | Alcalan .................. B64D 47/08 |
| 2020/0347888 | A1 | * | 11/2020 | Mathis ..................... F16D 3/04 |

\* cited by examiner

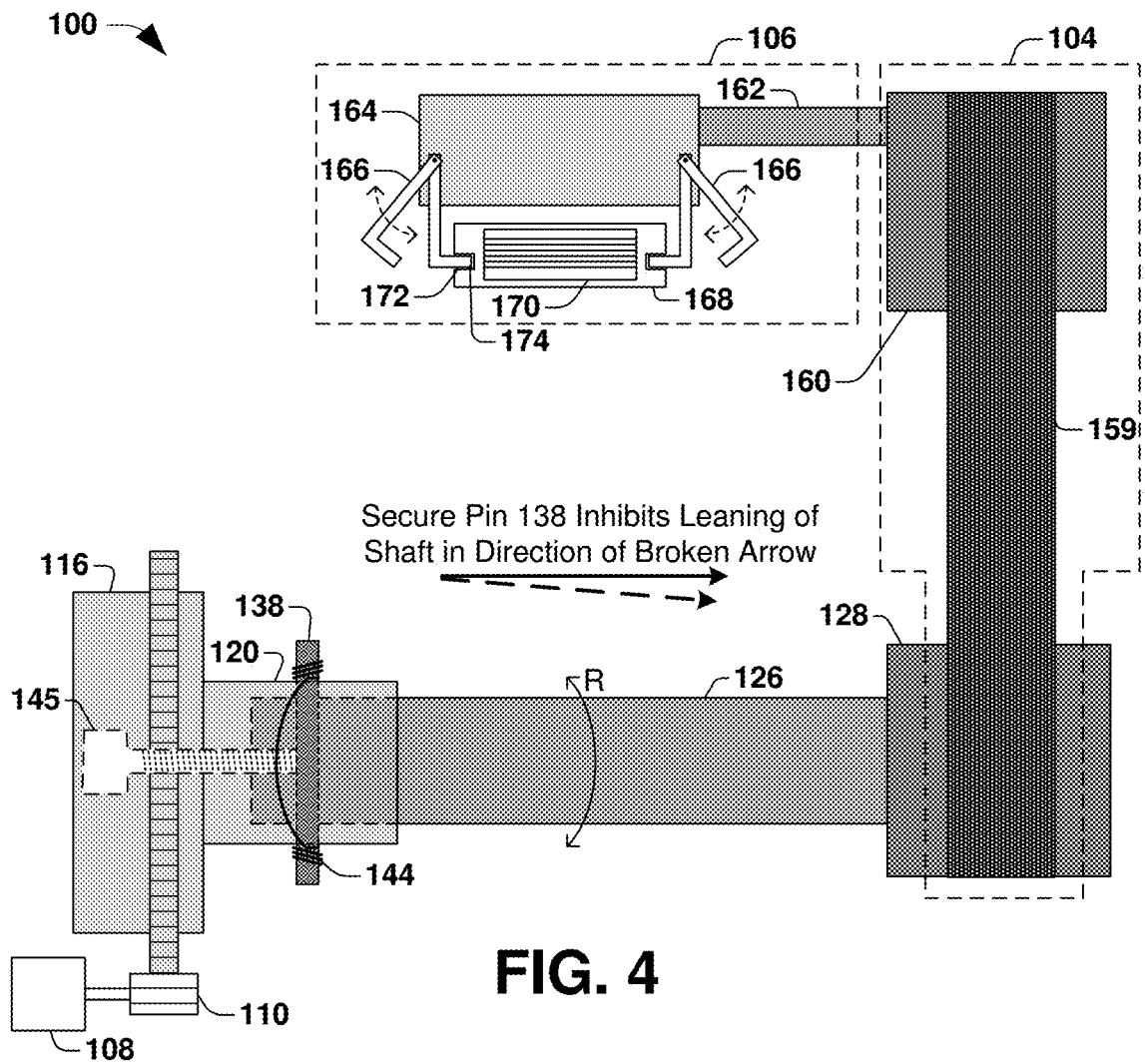
FIG. 4
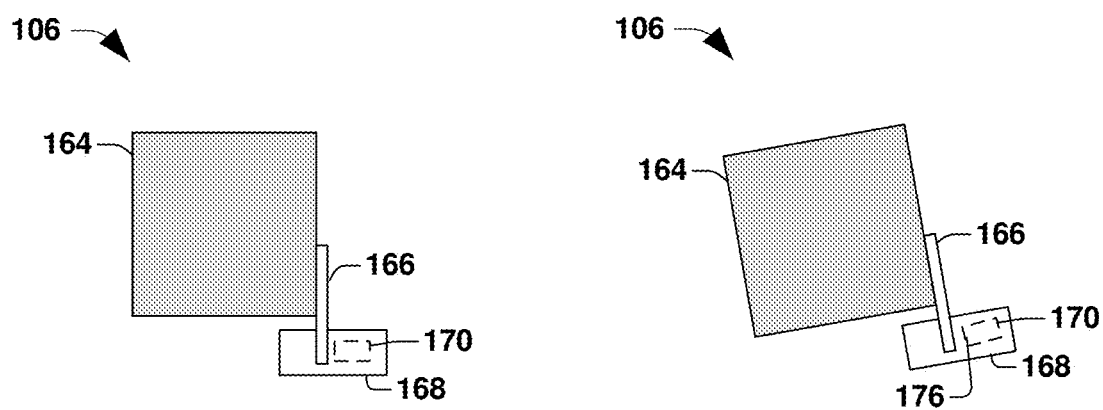
FIG. 5  FIG. 6

WAFER POD TRANSFER ASSEMBLY

RELATED APPLICATION

This application claims priority to U.S. Provisional Patent Application 63/179,177 titled "WAFER POD TRANSFER ASSEMBLY" and filed on Apr. 23, 2021, which is incorporated herein by reference.

BACKGROUND

During semiconductor device manufacturing, a semiconductor wafer undergoes one or more semiconductor device fabrication steps, each of which is performed at a specialized wafer workplace station within a wafer processing device. Wafer pods convey semiconductor wafers from outside the wafer processing device to inside the wafer processing device, and from inside the wafer processing device to outside the wafer processing device. Each wafer pod is capable of transporting a number of wafers. The pods are designed to have a particular internal environment, such as relatively free of contamination so that exposure of wafers to contaminants, particles, debris, etc. is relatively limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is an illustration of a wafer pod transfer assembly, according to some embodiments.

FIG. 5 is an illustration of a tilt assembly, according to some embodiments.

FIG. 6 is an illustration of a tilt assembly, according to some embodiments.

DETAILED DESCRIPTION

Figure 1A:
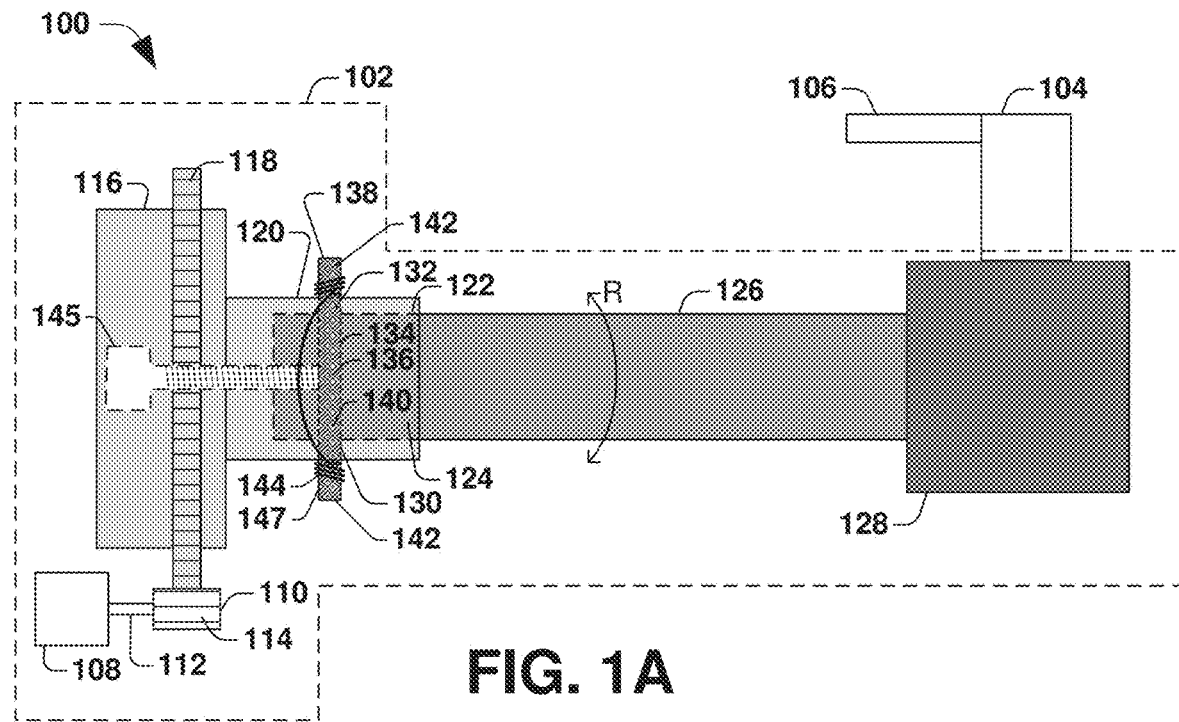
FIG. 1A is an illustration of a wafer pod transfer assembly, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

To process semiconductor wafers, wafers are transported from outside a wafer processing device to inside the wafer processing device for wafer processing. Processed wafers are transported from inside the wafer processing device to outside the wafer processing device. Within the wafer processing device, a wafer may be transported from a wafer workplace station to another wafer workplace station. Wafers may also be transported from a wafer workplace station within one wafer processing device to a wafer processing station within another wafer processing device. Within wafer processing devices, wafers are subjected to processes such as lithography, chemical mechanical polishing (CMP), annealing, cooling, or other suitable wafer processing processes. Wafer processes may be performed at one or more wafer workplace stations within one wafer processing device, or at one or more wafer workplace stations within more than one wafer processing device. For example, a wafer may be processed at a lithography workplace station within a wafer lithography processing device and processed at a CMP workplace station within a wafer CMP processing device.

Unprocessed and processed wafers are loaded into a protective wafer pod for transportation into and out of a wafer processing device. The protective wafer pod that encloses unprocessed and/or processed wafers is transported by a wafer pod transfer assembly into and out of the wafer processing device. The wafer pod includes one or more wafer cassettes that separately house each wafer within the wafer pod. The cost of breakage, malfunction, etc. should a wafer become mispositioned within a wafer cassette can be quite high. To combat this problem, a tilt assembly of the wafer pod transfer assembly tilts the wafer pod upwardly and rearwardly. When tilted in this fashion, the wafers inside the wafer pod become gravity loaded against rear surfaces of the wafer cassettes and are thereby situated to inhibit mispositioning or dislodgement that might be occasioned by vibrations of the wafer pod transfer assembly.

To further inhibit breakage, malfunction, mispositioning, etc. of wafers in wafer pods, and thereby increase yield, reduce costs, improve reliability, performance, etc. of resulting semiconductor devices, etc., a wafer pod transfer assembly is provided wherein vibration of the wafer pod transfer assembly is reduced or eliminated by maintaining stable and secure positioning and movement of components and mechanisms of the wafer pod transfer assembly. According to some embodiments, a wafer pod transfer assembly includes a tilt assembly having several moving components to tilt the wafer pod upwardly and rearwardly. The wafer pod transfer assembly may be within and/or used in association with a wafer processing device, such as a lithography processing device, a wafer CMP processing device, etc. According to some embodiments, the wafer pod transfer assembly comprises a wafer pod port to receive a wafer pod. The wafer pod port is coupled to a tilt assembly coupler. The wafer pod port and a received wafer pod may be tilted about a tilt axis of the tilt assembly coupler. A belt is coupled to the tilt assembly coupler and to a shaft. The tilt assembly coupler partially rotates and the received wafer pod tilts as the shaft partially rotates. The shaft is coupled to a gear. The gear is coupled to a motor and to a shaft receiver. A pin secures the shaft in the shaft receiver such that when the shaft receiver rotates, the shaft rotates. A pin screw secures the pin within the shaft receiver to inhibit the pin from shifting within the shaft receiver and/or the shaft. Further, a pin buckle secures the pin within the shaft receiver to inhibit the pin from shifting within the shaft receiver and/or the shaft. If the pin screw becomes loose or falls out, the pin buckle maintains the pin within the shaft receiver and the shaft.

Maintaining the pin within the shaft receiver and the shaft mitigates leaning of the shaft relative to the shaft receiver. Mitigating leaning of the shaft relative to the shaft receiver inhibits leaning of the tilt mechanism. Inhibiting leaning of the tilt mechanism mitigates mispositioning of wafers within the wafer cassette. Mitigating mispositioning of wafers within the wafer cassette facilitates reduction of wafer damage and wafer processing station down time. For example, mitigating mispositioning of wafers within the wafer cassette reduces misalignment of a wafer as the wafer is loaded to a wafer workplace station.

FIG. 1A is an illustration of a wafer pod transfer assembly 100, according to some embodiments. The wafer pod transfer assembly 100 comprises a rotation assembly 102, a drive assembly 104, and a tilt assembly 106. The rotation assembly 102 is mechanically or electromagnetically coupled to the drive assembly 104. The drive assembly 104 is mechanically or electromagnetically coupled to the tilt assembly 106. Other configurations of the wafer pod transfer assembly 100 are within the scope of the present disclosure.

According to some embodiments, the rotation assembly 102 comprises a motor 108 coupled to a first gear 110. A motor shaft 112 may couple the motor 108 to the first gear 110. The first gear 110 comprises first gear teeth 114. The rotation assembly 102 comprises a second gear 116 comprising second gear teeth 118. The second gear teeth 118 are engaged with the first gear teeth 114 of the first gear 110. The second gear 116 is coupled to a shaft receiver 120, such that when the first gear 110 rotates the second gear 116, the second gear 116 rotates the shaft receiver 120. According to some embodiments, the second gear 116 comprises the shaft receiver 120. Other configurations for rotating the shaft receiver 120 are within the scope of the present disclosure.

The shaft receiver 120 comprises first interior surfaces 122 defining a shaft receiving region 124 within the shaft receiver 120. A shaft 126 is disposed within the shaft receiving region 124 of the shaft receiver 120. The shaft 126 is coupled to a shaft coupler 128, such that when the shaft receiver 120 rotates (R) the shaft 126, the shaft coupler 128 rotates along with the shaft 126. Rotational torque of the first gear 110 is transferred to the tilt assembly 106 by way of the second gear 116, the shaft receiver 120, the shaft 126, the shaft coupler 128, and the drive assembly 104. Other configurations of the rotation assembly 102 for transferring rotational torque from the first gear 110 to the tilt assembly 106 are within the scope of the present disclosure.

According to some embodiments, the shaft receiver 120 comprises second interior surfaces 130 defining a pin receiving region 132 of the shaft receiver 120, and the shaft 126 comprises an interior surface 134 defining a pin receiving region 136 of the shaft 126. A pin 138 comprises a first pin region 140 traversing the pin receiving region 132 of the shaft receiver 120 and the pin receiving region 136 of the shaft 126. The pin 138 comprises second pin regions 142 disposed outside the shaft receiver 120. Other configurations of the shaft receiver 120 and the pin 138 are within the scope of the present disclosure.

According to some embodiments, the rotation assembly 102 comprises a pin screw 145 through the shaft receiver 120 and through the shaft 126. The pin screw 145 abuts a side surface 147 of the pin 138 so as to forcefully secure the pin 138 against the interior surface 134 of the shaft 126. According to some embodiments, the pin screw 145 is orientated perpendicular to an orientation of the pin 138. In some embodiments, a pin buckle 144 is orientated parallel to the orientation of the pin 138. Other configurations to secure the pin 138 against the interior surface 134 of the shaft 126 are within the scope of the present disclosure.

Figure 1B:
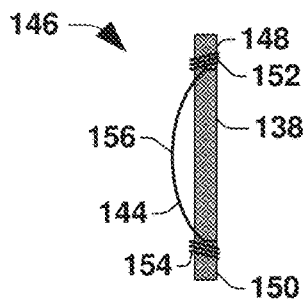
FIG. 1B is an illustration of a pin locking mechanism of the wafer pod transfer assembly of FIG. 1A, according to some embodiments.

As illustrated in FIG. 1B, the pin 138 and the pin buckle 144 comprise a pin locking mechanism 146, according to some embodiments. The pin 138 comprises a first end 148 and a second end 150, opposite the first end 148. The pin buckle 144 comprises a first loop 152 encircling the first end 148 of the pin 138 and a second loop 154 encircling the second end 150 of the pin 138. According to some embodiments, the pin buckle 144 is a C-type pin buckle comprising a C-shaped portion 156 between the first loop 152 and the second loop 154. The C-shaped portion 156 may partially encircle the shaft receiver 120 (as illustrated in FIG. 1A). Other configurations and shapes of the pin buckle 144 are within the scope of the present disclosure.

Figure 2:
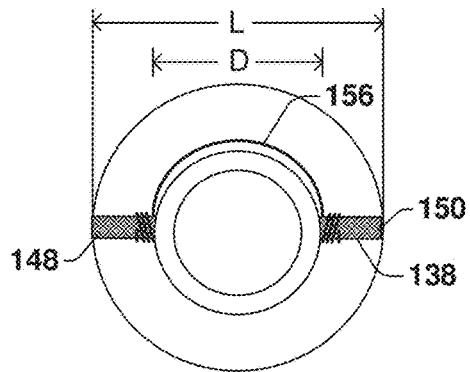
FIG. 2 is an illustration of a pin locking mechanism, according to some embodiments.

FIG. 2 is an illustration of a pin locking mechanism 158, according to some embodiments. The pin locking mechanism 158 comprises the components of the pin locking mechanism 146 of FIG. 1B. According to some embodiments, a diameter D of the C-shaped portion 156 of the pin locking mechanism 158 is less than a length L of the pin 138. In some embodiments, a measurement of the diameter D of the C-shaped portion 156 is ⅔ of a measurement of the length L of the pin 138. A ⅔ relative dimension between the diameter D of the C-shaped portion 156 of the pin locking mechanism 158 and the length L of the pin 138 is sufficient to allow the length L of the C-type pin buckle to temporarily extend for placement of the first loop 152 and the second loop 154 over the first end 148 of the pin 138 and the second end 150 of the pin 138 without permanently altering the diameter D of the C-shaped portion 156. Other relative dimensions of the diameter D of the C-shaped portion 156 of the pin locking mechanism 158 and the length L of the pin 138 are within the scope of the present disclosure.

Figure 3:
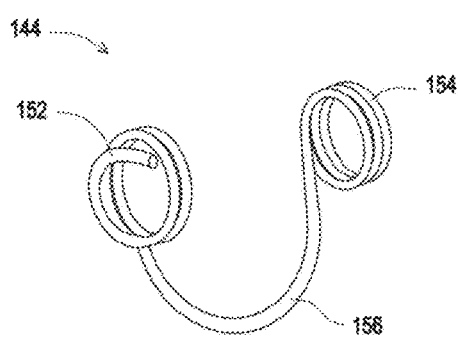
FIG. 3 is a perspective view of a pin buckle, according to some embodiments.

FIG. 3 is a perspective view of the pin buckle 144, according to some embodiments. The pin buckle 144 comprises the C-shaped portion 156, the first loop 152, and the second loop 154.

FIG. 4 is an illustration of the wafer pod transfer assembly 100, according to some embodiments. The wafer pod transfer assembly 100 comprises the motor 108, the first gear 110, the second gear 116, the shaft receiver 120, the shaft 126, the pin 138, the pin buckle 144, the pin screw 145, the shaft coupler 128, the drive assembly 104, and the tilt assembly 106. According to some embodiments, the drive assembly 104 comprises a tilt assembly coupler 160 coupled to the shaft coupler 128. A belt 159 may couple the tilt assembly coupler 160 to the shaft coupler 128 such that as the shaft 126 rotates the shaft coupler 128, the shaft coupler 128 causes the belt 159 to rotate and the rotating belt 159 causes the tilt assembly coupler 160 to rotate.

The tilt assembly 106 comprises a wafer pod port 164 comprising wafer pod carrying arms 166. The wafer pod carrying arms 166 are configured to rotate to engage with a wafer pod 168. The wafer pod 168 may comprise recessed surfaces 172 that define wafer pod carrying arm receptacles 174 for the wafer pod carrying arms 166. The wafer pod port 164 is configured to cause the wafer pod carrying arms 166 to engage the wafer pod carrying arm receptacles 174 for tilting and/or moving the wafer pod 168, and to release the wafer pod 168 at predetermined locations within or outside a wafer processing device (not shown). The wafer pod 168 comprises a wafer cassette 170 for receiving wafers (not shown). According to some embodiments, a transfer axle 162 is coupled to the wafer pod port 164 and to the tilt assembly coupler 160.

At noted in FIG. 4, the pin 138 inhibits leaning of the shaft 126 in the direction (downward to the right) of the broken arrow. Inhibiting leaning of the shaft 126 in the direction of the broken arrow reduces a degree to which the wafer pod 168 and the wafer cassette 170 lean in the direction of the broken arrow such that wafers are less likely to be mispositioned within the wafer cassette 170.

FIG. 5 is an illustration of the tilt assembly 106 in an un-tilted orientation, according to some embodiments. When the tilt assembly 106 is tilted upwardly and rearwardly, as illustrated in FIG. 6, wafers within the wafer cassette 170 abut rear surfaces 176 of the wafer cassette 170. The wafer pod 168 tilts upwardly and rearwardly in relation to rotation of the shaft 126, rotation of the tilt assembly coupler 160, and rotation of the wafer pod port 164. According to some embodiments, a standard mechanical interface load port transfer (SMIF-LPT) comprises the wafer pod port 164 and is configured to transfer the wafer pod port 164 to a tool load lock.

Figure 7:
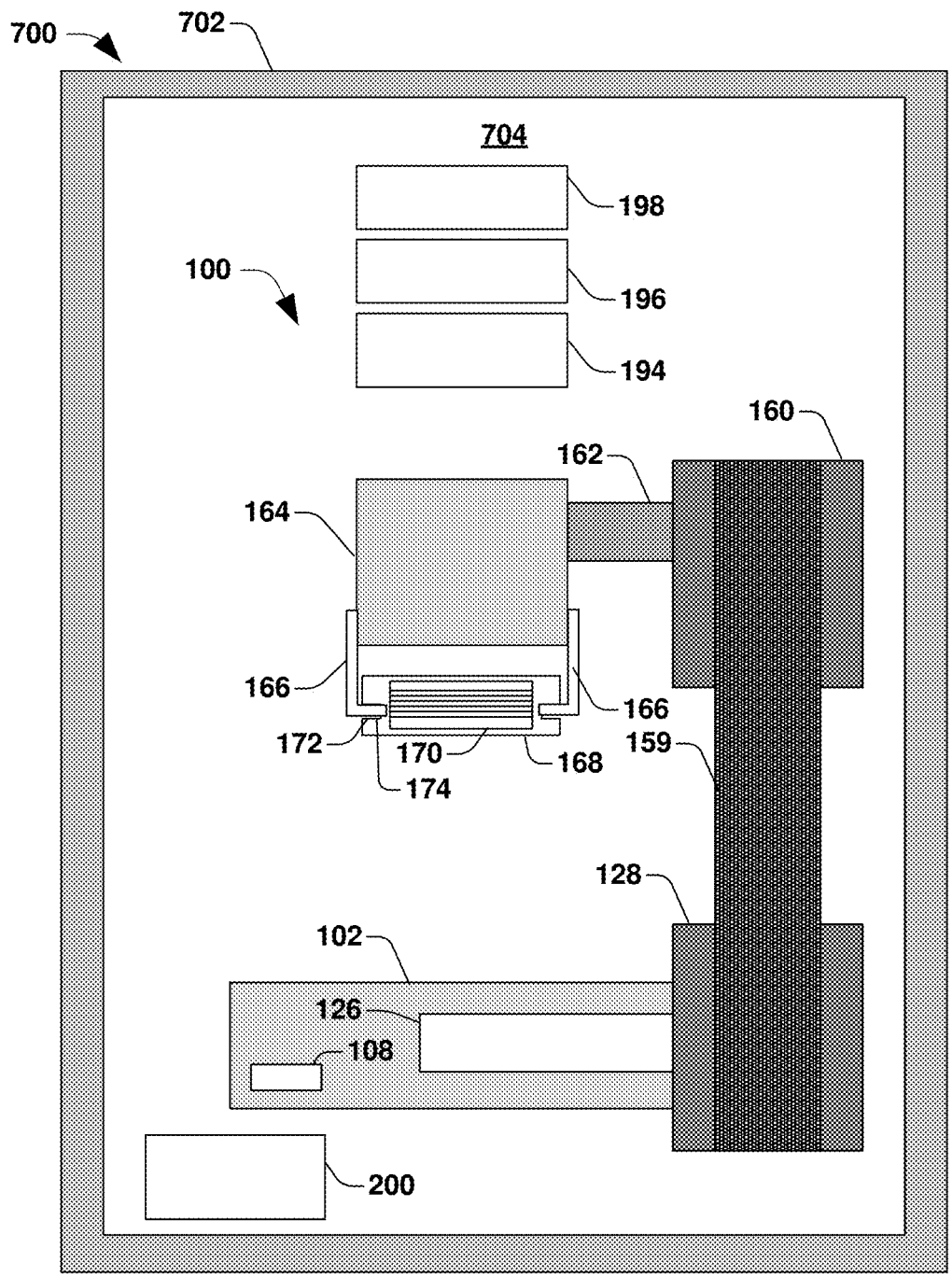
FIG. 7 is an illustration of a wafer processing device, according to some embodiments.

FIG. 7 is an illustration of a wafer processing device 700, according to some embodiments. The wafer processing device 700 comprises a housing 702 defining a wafer pod transfer assembly chamber 704. The wafer pod transfer assembly chamber 704 houses the wafer pod transfer assembly 100, including the rotation assembly 102, the shaft coupler 128, the belt 159, the tilt assembly coupler 160, the transfer axle 162, the wafer pod port 164, and the wafer pod carrying arms 166. The wafer processing device 700 comprises a load port 194 adapted to receive and carry a plurality of wafers (not shown). An interface module 196 communicates between the load port 194 and a load lock chamber 198 so as to transfer the wafers between the load port 194 and the load lock chamber 198.

A controller 200 communicates with the rotation assembly 102 to control the motor 108 to rotate the shaft 126 to tilt the wafer pod port 164 to gravity load wafers against rear surfaces of the wafer cassette 170. The wafers are thereby situated to inhibit mispositioning or dislodgement that might be occasioned by vibrations of the wafer pod transfer assembly 100.

The controller 200 communicates with the wafer pod port 164 to control movement of the wafer pod carrying arms 166 to engage the wafer pod 168. For example, the controller 200 may communicate with the wafer pod port 164 to rotate the wafer pod carrying arms 166 to engage recessed surfaces 172 of the wafer pod 168 that define wafer pod carrying arm receptacles 174 of the wafer pod 168.

Figure 8:
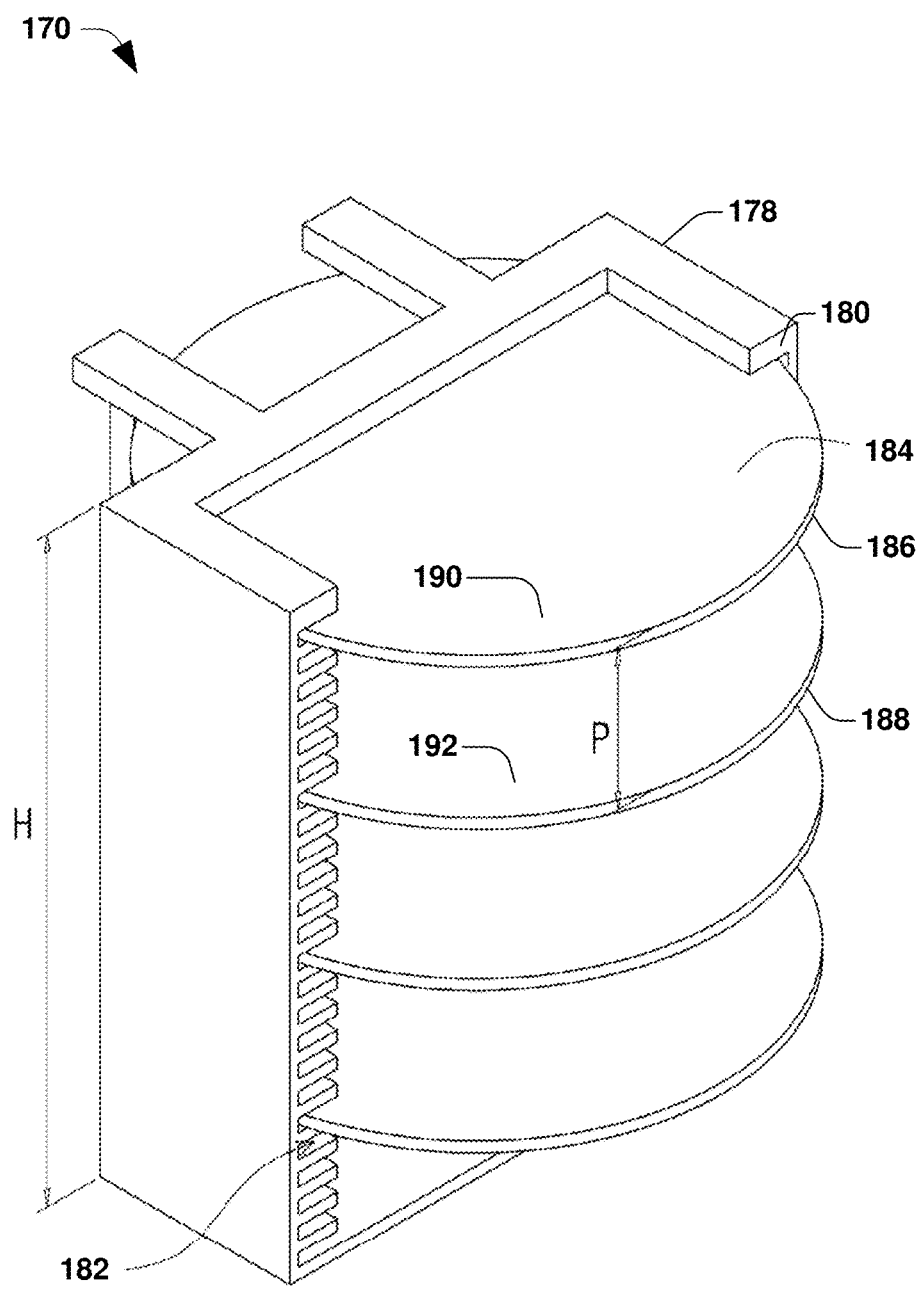
FIG. 8 is a perspective view of a wafer cassette, according to some embodiments.

FIG. 8 is a perspective view of the wafer cassette 170, according to some embodiments. The wafer cassette 170 may comprise a housing 178. The housing 178 may comprise an open, forward-facing surface 180 defining a plurality of parallel, spaced apart horizontal slots 182. The horizontal slots 182 are configured to receive and hold a plurality of wafers 184 and permit loading and unloading of the wafers 184 to and from the wafer cassette 170. Loading and unloading of the wafers 184 may be performed through the use of precision robotics (not shown).

The loading and unloading of the wafers 184 to and from the wafer cassette 170 may be carried out robotically. Typically, a fully loaded wafer cassette 170, holding a plurality of wafers, is placed in the unload compartment of a chemical mechanical polishing (CMP) machine, cleaning machine, or other wafer processing device or station. According to some embodiments, an unloading robotic arm sequentially retrieves the wafers 184 one at a time from the wafer cassette 170 and transports each of the wafers 184 to a wafer processing station. The wafers 184 may thereafter be moved through a number of wafer processing stations within the wafer processing device. When wafer processing is complete, the wafers 184 are retrieved by a loading robotic arm from a final wafer processing station and transported and loaded into slots of an empty wafer cassette in a load compartment of the wafer processing device 700 (not shown). In some embodiments, after a wafer cassette is loaded with processed wafers, the wafer cassette may be grasped by a handle (not shown) and transported to a subsequent wafer processing device. For economy and interchangeability, the same or similar wafer cassette housings may be employed both as unload wafer cassettes and as load wafer cassettes and may be configured for use with a broad variety of wafer processing devices.

The wafer cassette 170 has a height H. According to some embodiments, the wafers 184 may be loaded into the wafer cassette 170 so as to define a pitch P between each of the wafers 184. The pitch P may be, for example, measured from a bottom surface 186 of a first wafer 190 to a bottom surface 188 of a second wafer 192, adjacent the first wafer 190. The pitch P between two wafers 184 may be defined as the height H of the wafer cassette 170 divided by the number of wafers 184 in the wafer cassette 170. In some embodiments, the number of horizontal slots 182 may be greater than the number of wafers 184 in the wafer cassette 170. For example, as illustrated in FIG. 8 the number of wafers 184 is four, and the number of horizontal slots 182 is 24. In some embodiments, the number of horizontal slots 182 and the number of wafers are the same number. In some embodiments, the number of wafers 184 is predetermined to achieve a desired pitch P. As the number of wafers 184 is decreased, the value of the pitch P increases. As the number of wafers 184 is increased, the value of the pitch P decreases. According to some embodiments, a greater pitch P corresponds to a greater rate of wafer cooling of processed wafers. A greater rate of wafer cooling may improve the efficiency and speed of a wafer annealing process, as an example. Other configurations of the wafer cassette 170 are within the scope of the present disclosure.

Figure 9:
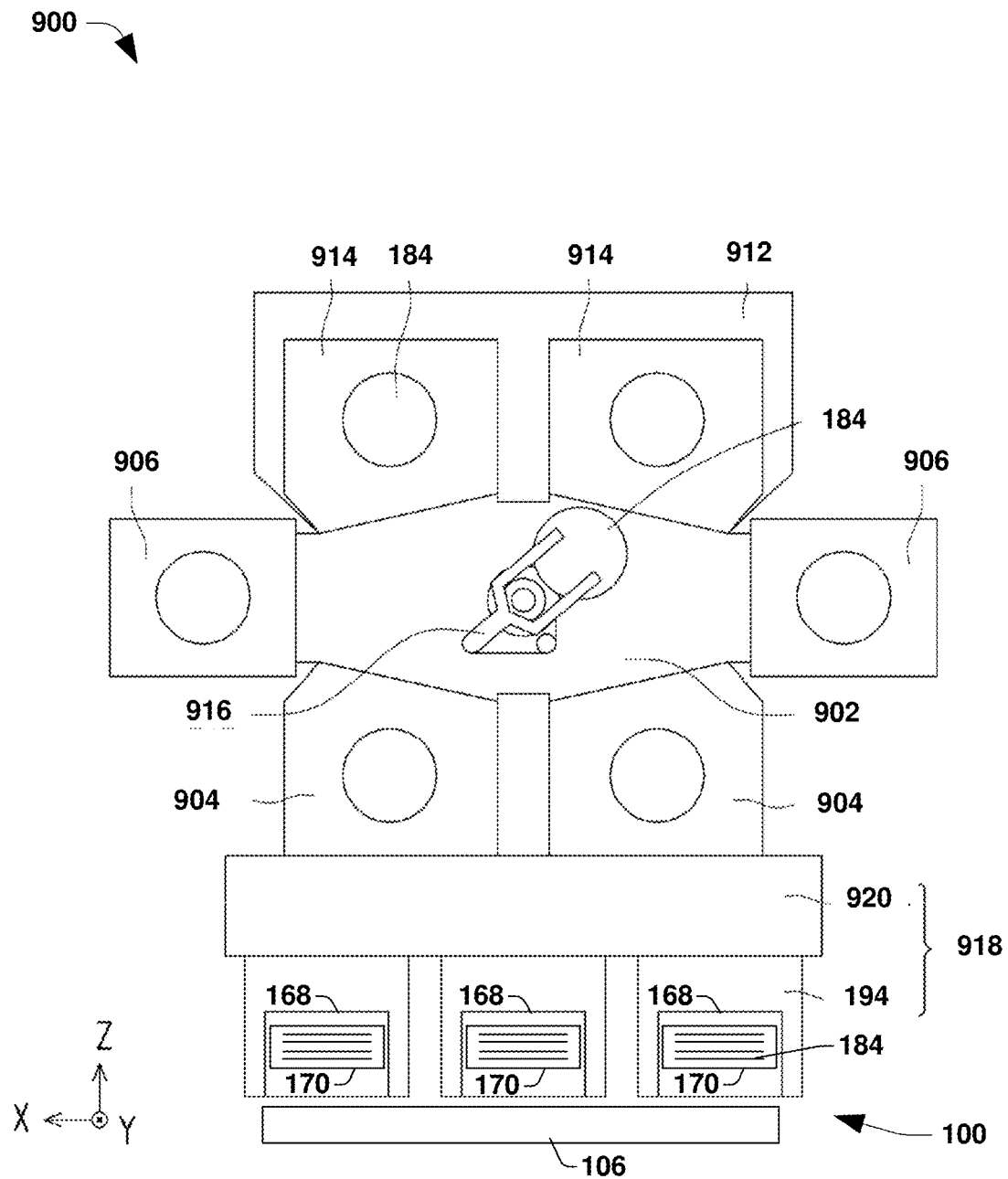
FIG. 9 is a schematic top view of a wafer processing station, according to some embodiments.

FIG. 9 is a schematic top view of a wafer processing station 900, according to some embodiments. The wafer processing station 900 may comprise the wafer pod transfer assembly 100, a central transfer chamber 902, a load lock chamber 904, and a cooling stage 906. The wafer processing station 900 comprises a plurality of load ports 194. One or more load ports 194 may contain one or more wafer pods 168. One or more wafer pods 168 may contain one or more wafer cassettes 170 containing one or more wafers 184. One or more wafer pods 168 may be loaded into one or more load ports 194 by the tilt assembly 106 of the wafer pod transfer assembly 100. As discussed above and further below, the tilt assembly facilitates wafer handling, loading, etc. in a desired manner, such as to mitigate mispositioning of wafers, which, in turn, increases yield, reduces waste, inhibits defects, promotes desired device formation, etc.

The load lock chamber 904 may be disposed adjacent to the central transfer chamber 902. The load lock chamber 904 may be adapted to contain a plurality of wafers 184. In some embodiments, the cooling stage 906 is disposed adjacent to the load lock chamber 904 and the central transfer chamber 902. The central transfer chamber 902 may be configured to communicate with the cooling stage 906 and the load lock chamber 904 for transferring a wafer 184 between the cooling stage 906 and the load lock chamber 904.

In some embodiments, the wafer processing station 900 comprises a platform 912 disposed adjacent to the central transfer chamber 902. The platform 912 comprises a plurality of processing modules 914. The central transfer chamber 902 communicates between the platform 912 and the load lock chamber 904 to transfer a wafer 910 between the platform 912 and the load lock chamber 904. Specifically, the central transfer chamber 902 may be surrounded by the load lock chambers 904 (two are shown), the cooling stages 906 (two are shown), and the platform 912 having the processing modules 914 (two are shown). The number of load lock chambers 904, the number of cooling stages 906, and/or the number of processing modules 914 as illustrated are merely exemplary. In some embodiments, the number of load lock chambers 904, the number of cooling stages 906, and the number of processing modules 914 may be adjustable to accommodate wafer processing requirements.

In some embodiments, the central transfer chamber 902 communicates between the processing modules 914, the load lock chambers 904, and the cooling stages 906 through an interface robot 916 that is configured to move around in the central transfer chamber 902. The interface robot 916 may carry the wafer 910 and place the wafer 910 in one of the processing modules 914, the load lock chambers 904, and/or the cooling stages 906. In FIG. 9, each of the processing modules 914, the load lock chambers 904, and the cooling stages 906 are shown carrying a wafer for descriptive purposes only and are merely exemplary. While the wafer processing station 900 is running, each of the processing modules 914, the load lock chambers 904, and/or the cooling stages 906 may not be carrying a wafer.

In some embodiments, the wafer processing station 900 includes an equipment front end module (EFEM) 918. The EFEM 918 comprises an interface module 920 and the plurality of load ports 194 (three are shown as an example). The interface module 920 of the EFEM 918 communicates between the load ports 194 and the load lock chambers 904 so as to transfer the wafers between the load ports 194 and the load lock chambers 904. The shapes of the elements of the wafer processing station 900 shown in FIG. 9 are merely exemplary and illustrated only as examples for description purposes.

In some embodiments, the interface module 920 transfers the wafers (to be processed) from the load ports 194 to the corresponding load lock chambers 904. Thus, the central transfer chamber 902 and the interface robot 916 may carry a wafer to be processed from the load lock chamber 904 to the processing module 914. In some embodiments, while a wafer is being processed, the interface robot 916 may carry another wafer from the load lock chamber 904 to another processing module 914. After the wafer is processed in the interface robot 916, the interface robot 916 may retrieve the processed wafer and carry the processed wafer to the cooling stage 906 for cooling. After the processed wafer is cooled to a certain temperature, the interface robot 916 may move the processed wafer from the cooling stage 906 to the load lock chamber 904. The temperature at which the processed wafer is cooled enough to be moved to the load lock chamber 904 may be predetermined. This process may continue as the interface robot 916 moves wafers from the load lock chamber 904 to the processing modules 914 for processing and moves the processed wafers from the processing modules 914 to the cooling stage 906. After the processed wafer at the cooling stage 906 is cooled, the interface robot 916 may move the processed wafer from the cooling stage 906 to the load lock chamber 904. When the load lock chamber 904 is full of processed wafers, the interface module 920 may transfer the processed wafers to the load port 194 to exit the wafer processing station 900.

In some embodiments, the cooling stage 906 is cooled to a predetermined temperature prior to receiving a processed wafer. The cooling stage 906 may be cooled by flowing a cooling fluid therethrough. In some embodiments, the cooling stage 906 may have cooling fluid flow below the cooling stage 906 so as to reduce the temperature of the cooling stage 906. Then, by placing the processed wafer into the cooling stage 906, the processed wafer may immediately start to cool. The cooling liquid may continually flow below the cooling stage 906. The frequency and amount of cooling liquid flowing around or below the cooling stage 906 may be adjustable, according to some embodiments.

In some embodiments, because the wafer processing station 900 includes the cooling stage 906, when the wafers are processed (for example annealed to reduce a hillock phenomenon), the faster cooling in the cooling stage 906 may provide a faster annealing process. The faster annealing process may improve the efficiency of enlarging metal grain sizes (for example copper grain sizes) of processed wafers. The cooling effect provided by the cooling stage 906 may improve the efficiency and speed of the annealing process for reducing the hillock phenomenon.

As disclosed, the wafer pod transfer assembly 100 comprises the tilt assembly 106 for desirably loading wafers into the wafer processing station 900. The wafer pod transfer assembly 100 comprises the pin 138 traversing the pin receiving region 132 of the shaft receiver 120 and the pin receiving region 136 of the shaft 126. The pin 138 comprises the second pin regions 142 disposed outside the shaft receiver 120. The pin 138 comprises the first end 148 and the second end 150, opposite the first end 148. The pin buckle 144 comprises the first loop 152 encircling the first end 148 of the pin 138 and the second loop 154 encircling the second end 150 of the pin 138. The pin buckle 144 may be a C-type pin buckle comprising the C-shaped portion 156 between the first loop 152 and the second loop 154. The C-shaped portion 156 may partially encircle the shaft receiver 120. The pin buckle 144 secures the pin 138 within the shaft receiver 120 to inhibit the pin 138 from shifting within the shaft receiver 120 and/or the shaft 126. If the pin screw 145 becomes loose or falls out, the pin buckle 144 maintains the pin 138 within the shaft receiver 120 and the shaft 126.

Maintaining the pin 138 within the shaft receiver 120 and the shaft 126 mitigates leaning of the shaft 126 relative to the shaft receiver 120. Mitigating leaning of the shaft 126 relative to the shaft receiver 120 inhibits leaning of the tilt assembly 106. Inhibiting leaning of the tilt assembly 106 mitigates mispositioning of wafers within the wafer cassette 170. Mitigating mispositioning of wafers within the wafer cassette 170 facilitates reduction of wafer damage and wafer processing station 900 down time. For example, mitigating mispositioning of wafers within the wafer cassette reduces misalignment of a wafer as the wafer is loaded into the wafer processing station 900.

Figure 10:
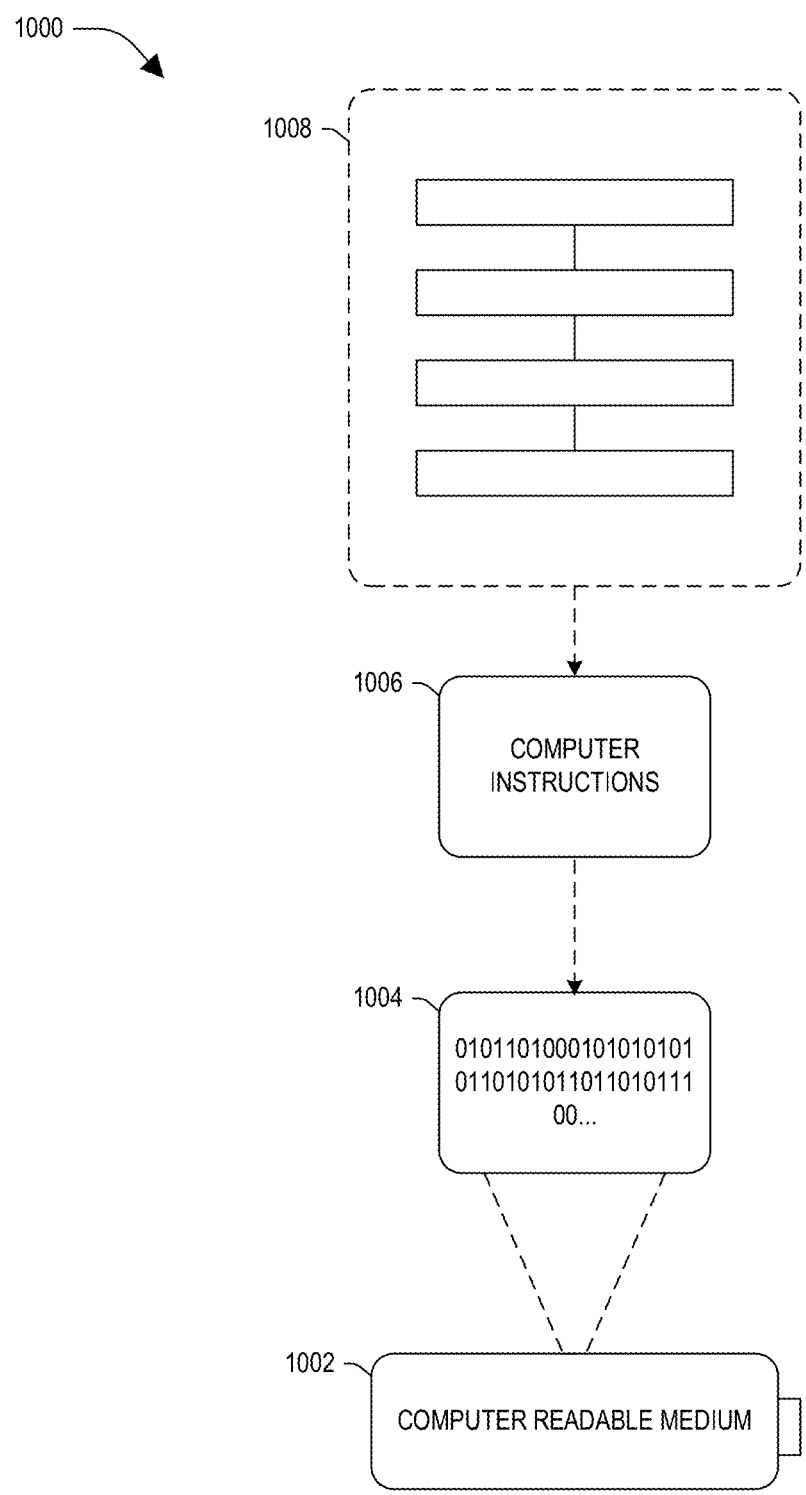
FIG. 10 illustrates an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 10, wherein the embodiment 1000 comprises a computer-readable medium 1002 (e.g., a CD-R, DVD-R, flash drive, a platter of a hard disk drive, etc.), on which is encoded computer-readable data 1004. This computer-readable data 1004 in turn comprises a set of processor-executable computer instructions 1006 configured to operate according to one or more of the principles set forth herein. In some embodiments 1000, the processor-executable computer instructions 1006 are configured to perform a method 1008, such as at least some of the aforementioned described methods. In some embodiments, the processor-executable computer instructions 1006 are configured to implement a system, such as at least some of the aforementioned systems. Many such computer-readable media may be devised by those of ordinary skill in the art that are configured to operate in accordance with the techniques presented herein.

Figure 11:
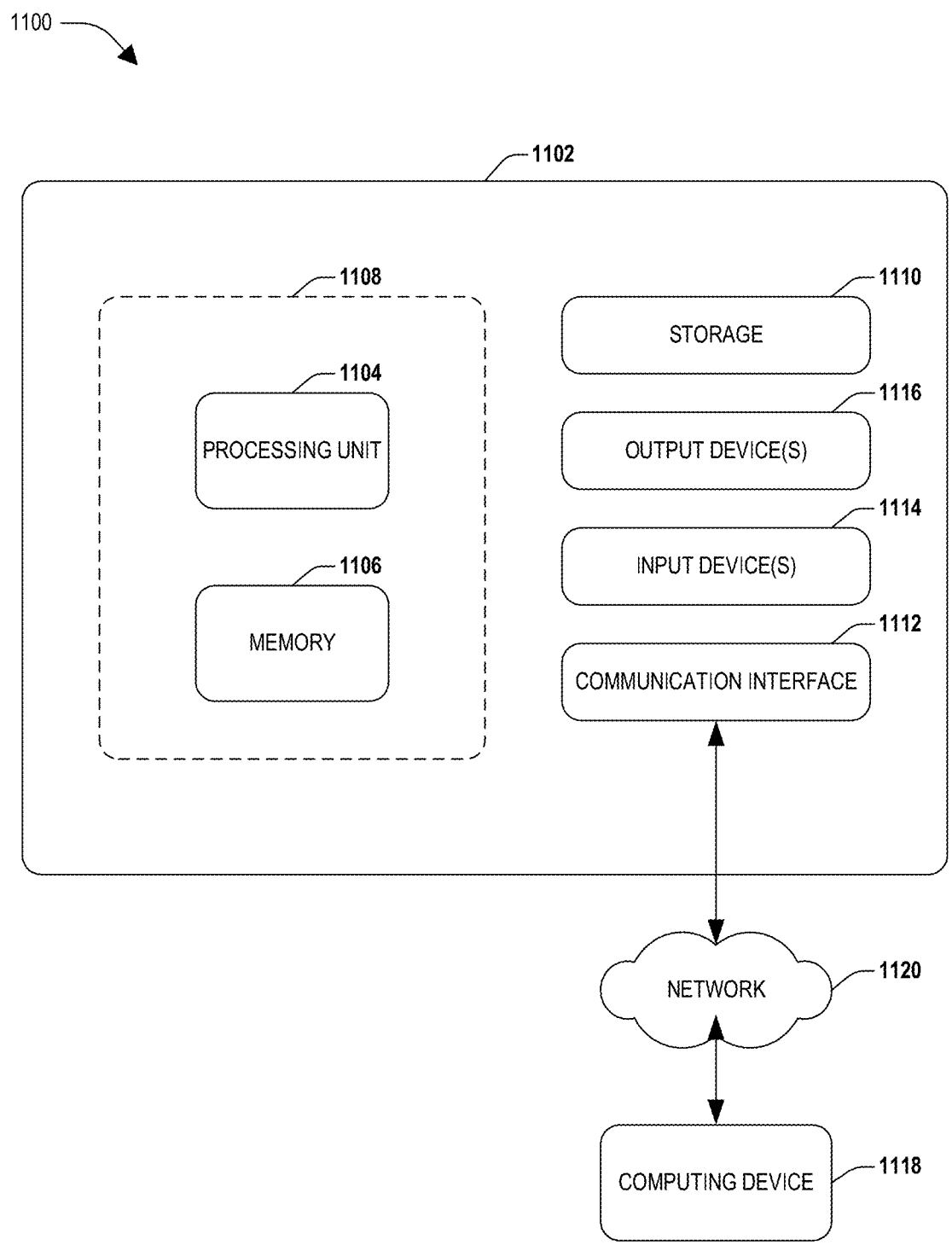
FIG. 11 illustrates an example computing environment wherein one or more of the provisions set forth herein may be implemented, in accordance with some embodiments.

FIG. 11 and the following discussion provide a brief, general description of a suitable computing environment to implement embodiments of one or more of the provisions set forth herein. The operating environment of FIG. 11 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 11 depicts an example of a system 1100 comprising a computing device 1102 to implement some embodiments provided herein. In some configurations, computing device 1102 includes at least one processing unit 1104 and memory 1106. Depending on the exact configuration and type of computing device, the memory 1106 may be volatile (such as RAM, for example), non-volatile (such as ROM, flash memory, etc., for example) or some combination of the two. This configuration is illustrated in FIG. 11 by dashed line 1108.

In some embodiments, the computing device 1102 may include additional features and/or functionality. For the example, the computing device 1102 may also include additional storage (e.g., removable and/or non-removable) including, but not limited to, magnetic storage, optical storage, and the like. Such additional storage is illustrated in FIG. 11 by storage 1110. In some embodiments, computer readable instructions to implement one or more embodiments provided herein may be in the storage 1110. The storage 1110 may also store other computer readable instructions to implement an operating system, an application program, and the like. Computer readable instructions may be loaded in the memory 1106 for execution by processing unit 1104, for example.

The term "computer readable media" as used herein includes computer storage media. Computer storage media includes volatile and nonvolatile, removable and non-removable media implemented in any method or technology for storage of information such as computer readable instructions or other data. The memory 1106 and storage 1110 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by the computing device 1102. Any such computer storage media may be part of the computing device 1102.

In some embodiments, the computing device 1102 comprises a communication interface 1112, or a multiple communication interfaces, that allow the computing device 1102 to communicate with other devices. The communication interface 1112 may include, but is not limited to, a modem, a Network Interface Card (NIC), an integrated network interface, a radio frequency transmitter/receiver, an infrared port, a Universal Serial Bus (USB) connection, or other interface for connecting the computing device 1102 to other computing devices. The communication interface 1112 may implement a wired connection or a wireless connection. The communication interface 1112 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

The computing device 1102 may include input device(s) 1114 such as keyboard, mouse, pen, voice input device, touch input device, infrared cameras, video input devices, and/or any other suitable input device. An output device(s) 1116 such as one or more displays, speakers, printers, and/or any other suitable output device may also be included in the computing device 1102. The input device(s) 1114 and the output device(s) 1116 may be connected to the computing device 1102 via a wired connection, wireless connection, or any combination thereof. In some embodiments, an input device or an output device from another computing device may be used as the input device(s) 1114 or the output device(s) 1116 for the computing device 1102.

Components of the computing device 1122 may be connected by various interconnects, such as a bus. Such interconnects may include a Peripheral Component Interconnect (PCI), such as PCI Express, a USB, firewire (IEEE 1394), an optical bus structure, and the like. In some embodiments, components of the computing device 1102 may be interconnected by a network. For example, the memory 1106 may be comprised of multiple physical memory units located in different physical locations interconnected by a network.

Those skilled in the art will realize that storage devices utilized to store computer readable instructions may be distributed across a network. For example, a computing device 1118 accessible via a network 1120 may store computer readable instructions to implement one or more embodiments provided herein. The computing device 1102 may access the computing device 1118 and download a part or all of the computer readable instructions for execution. Alternatively, the computing device 1102 may download pieces of the computer readable instructions, as needed, or some instructions may be executed at the computing device 1102 and some instructions may be executed at the computing device 1118.

According to some embodiments, a wafer pod transfer assembly includes a wafer pod port to receive a wafer pod, a transfer axle coupled to the wafer pod port, a shaft receiver, a shaft coupled to the transfer axle and to the shaft receiver, a pin through the shaft receiver and through the shaft, wherein the pin comprises a first end and a second end, opposite the first end, and a pin buckle including a first loop and a second loop. The pin buckle is coupled to the pin, the first loop encircles the first end of the pin, and the second loop encircles the second end of the pin.

According to some embodiments, a wafer pod transfer assembly includes a wafer pod port to receive a wafer pod, a shaft coupled to the wafer pod port, a shaft receiver coupled to the shaft, a pin through the shaft receiver and through the shaft, and a pin buckle coupled to the pin, wherein the pin buckle comprises a first loop encircling a first end of the pin, a second loop encircling a second end of the pin, different than the first end of the pin, and a C-shaped portion between the first loop and the second loop, wherein the C-shaped portion partially encircles the shaft receiver.

According to some embodiments, a wafer pod transfer assembly includes a shaft receiver including first interior surfaces defining a shaft receiving region of the shaft receiver, and second interior surfaces defining a pin receiving region of the shaft receiver. The wafer pod transfer assembly includes a shaft disposed within the shaft receiving region and a pin including a first pin region traversing the pin receiving region, a first end, and a second end. The wafer pod transfer assembly includes a pin buckle including a first loop encircling the first end of the pin, a second loop encircling the second end of the pin, and a C-shaped portion between the first loop and the second loop. The wafer pod transfer assembly comprises a drive assembly coupled to the shaft and a tilt assembly coupled to the drive assembly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A wafer pod transfer assembly, comprising:
   a wafer pod port to receive a wafer pod;
   a transfer axle coupled to the wafer pod port;
   a shaft receiver;
   a shaft coupled to the transfer axle and to the shaft receiver;
   a belt coupled to the transfer axle and to the shaft;
   a pin through the shaft receiver and through the shaft, wherein the pin comprises a first end and a second end, opposite the first end; and
   a pin buckle comprising a first loop and a second loop, wherein:
      the pin buckle is coupled to the pin,
      the first loop encircles the first end of the pin, and
      the second loop encircles the second end of the pin.

2. The wafer pod transfer assembly of claim 1, wherein the pin buckle is a C-type pin buckle.

3. The wafer pod transfer assembly of claim 1, wherein the shaft is within the shaft receiver.

4. The wafer pod transfer assembly of claim 1, comprising a gear coupled to the shaft receiver.

5. The wafer pod transfer assembly of claim 4, wherein the gear comprises the shaft receiver.

6. The wafer pod transfer assembly of claim 1, comprising a pin screw through the shaft receiver and through the shaft, wherein the pin screw abuts a side surface of the pin.

7. The wafer pod transfer assembly of claim 1, comprising:
   a wafer pod port coupled to the transfer axle, wherein the wafer pod port comprises wafer pod carrying arms configured to rotate to engage with a wafer pod.

8. The wafer pod transfer assembly of claim 1, wherein a diameter D of the pin buckle is less than a length L of the pin.

9. A wafer pod transfer assembly, comprising:
   a wafer pod port to receive a wafer pod;
   a shaft coupled to the wafer pod port;
   a shaft receiver coupled to the shaft;
   a pin screw through the shaft receiver and through the shaft;
   a pin through the shaft receiver and through the shaft; and
   a pin buckle coupled to the pin, wherein the pin buckle comprises:
      a first loop encircling a first end of the pin;
      a second loop encircling a second end of the pin, different than the first end of the pin; and
      a C-shaped portion between the first loop and the second loop, wherein the C-shaped portion partially encircles the shaft receiver.

10. The wafer pod transfer assembly of claim 9, wherein:
    the pin screw is orientated perpendicular to an orientation of the pin, and
    the pin buckle is orientated parallel to the orientation of the pin.

11. The wafer pod transfer assembly of claim 9, wherein the shaft is within the shaft receiver.

12. The wafer pod transfer assembly of claim 9, wherein a diameter D of the pin buckle is less than a length L of the pin.

13. A wafer pod transfer assembly, comprising:
    a shaft receiver comprising:
       first interior surfaces defining a shaft receiving region of the shaft receiver; and
       second interior surfaces defining a pin receiving region of the shaft receiver;
    a shaft disposed within the shaft receiving region;
    a pin comprising:
       a first pin region traversing the pin receiving region;
       a first end; and
       a second end;
    a pin buckle comprising:
       a first loop encircling the first end of the pin;
       a second loop encircling the second end of the pin; and
       a C-shaped portion between the first loop and the second loop;
    a pin screw through the shaft receiver and through the shaft, wherein the pin screw abuts a side surface of the pin;
    a drive assembly coupled to the shaft; and
    a tilt assembly coupled to the drive assembly.

14. The wafer pod transfer assembly of claim 13, wherein the tilt assembly comprises a wafer pod port coupled to the drive assembly.

15. The wafer pod transfer assembly of claim 13, wherein the tilt assembly comprises wafer pod carrying arms configured to engage a wafer pod.

16. The wafer pod transfer assembly of claim 13, comprising:
    a motor;
    a first gear coupled to the motor for movement by the motor, wherein the first gear comprises first gear teeth; and
    a second gear comprising second gear teeth engaged with the first gear teeth, and wherein the second gear is coupled to the shaft receiver, wherein:
       rotational torque of the first gear from movement by the motor is transferred to the tilt assembly by way of the second gear, the shaft receiver, the shaft, and the drive assembly.

17. The wafer pod transfer assembly of claim 13, wherein the C-shaped portion of the pin buckle partially encircles the shaft receiver.

18. The wafer pod transfer assembly of claim 1, comprising a pin screw through the shaft receiver and through the shaft.

19. The wafer pod transfer assembly of claim 9, comprising:
    a transfer axle coupled to the wafer pod port; and
    a belt coupled to the transfer axle and to the shaft.

20. The wafer pod transfer assembly of claim 13, wherein:
the tilt assembly comprises a wafer pod port to receive a wafer pod and a transfer axle coupled to the wafer pod port, and
the drive assembly comprises a belt coupled to the transfer axle and to the shaft.

\* \* \* \* \*